US011159140B2

(12) United States Patent
Gaudin et al.

(10) Patent No.: US 11,159,140 B2
(45) Date of Patent: Oct. 26, 2021

(54) HYBRID STRUCTURE FOR A SURFACE ACOUSTIC WAVE DEVICE

(71) Applicant: Soitec, Bernin (FR)

(72) Inventors: Gweltaz Gaudin, Grenoble (FR); Isabelle Huyet, Crolles (FR)

(73) Assignee: Soitec, Bernin (FR)

( * ) Notice: Subject to any disclaimer, the term of this patent is extended or adjusted under 35 U.S.C. 154(b) by 19 days.

(21) Appl. No.: 16/313,804

(22) PCT Filed: Jun. 26, 2017

(86) PCT No.: PCT/FR2017/051701
§ 371 (c)(1),
(2) Date: Dec. 27, 2018

(87) PCT Pub. No.: WO2018/002504
PCT Pub. Date: Jan. 4, 2018

(65) Prior Publication Data
US 2019/0372552 A1    Dec. 5, 2019

(30) Foreign Application Priority Data

Jun. 30, 2016  (FR) ...................... 1656191

(51) Int. Cl.
*H03H 9/02*  (2006.01)
*H01L 41/08*  (2006.01)

(52) U.S. Cl.
CPC ..... *H03H 9/02834* (2013.01); *H01L 41/0815* (2013.01); *H03H 9/02559* (2013.01); *H03H 9/02566* (2013.01); *H03H 9/02574* (2013.01)

(58) Field of Classification Search
CPC .......... H03H 9/02559; H03H 9/02566; H03H 9/02574; H03H 9/02834; H03H 9/25
See application file for complete search history.

(56) References Cited

U.S. PATENT DOCUMENTS 10,250,282 B2*  4/2019  Kononchuk ...... H01L 21/02378
10,381,998 B2*  8/2019  Inoue ...................... H03H 3/02
10,541,667 B2*  1/2020  Gilbert ............... H03H 9/02574
(Continued)

FOREIGN PATENT DOCUMENTS

DE    102004045181 A1    3/2006
JP    1986-288506 A    12/1986
(Continued)

OTHER PUBLICATIONS

International Written Opinion for International Application No. PCT/FR2017/051701 dated Nov. 9, 2017, 4 pages.
(Continued)

*Primary Examiner* — Dean O Takaoka
*Assistant Examiner* — Alan Wong
(74) *Attorney, Agent, or Firm* — TraskBritt

(57) ABSTRACT

A hybrid structure for a surface acoustic wave device comprises a useful layer of piezoelectric material having a free first surface and a second surface disposed on a support substrate that has a lower coefficient of thermal expansion than that of the useful layer. The hybrid structure further comprises a trapping layer disposed between the useful layer and the support substrate, and at least one functional interface of predetermined roughness between the useful layer and the trapping layer.

10 Claims, 8 Drawing Sheets

(56) References Cited

U.S. PATENT DOCUMENTS

| | | |
|---|---|---|
| 2007/0032040 A1 | 2/2007 | Lederer |
| 2007/0296306 A1 | 12/2007 | Hauser et al. |
| 2012/0086312 A1 | 4/2012 | Kobayashi et al. |
| 2019/0036009 A1* | 1/2019 | Tai ..................... H01L 41/1871 |

FOREIGN PATENT DOCUMENTS

| | | | |
|---|---|---|---|
| JP | 1998-297931 A | 11/1998 | |
| JP | 2002-094355 A | 3/2002 | |
| JP | 2002-100958 A | 4/2002 | |
| JP | 2002-135076 A | 5/2002 | |
| JP | 2005-229455 A | 8/2005 | |
| JP | 2007-134889 A | 5/2007 | |
| JP | 2012-085286 A | 4/2012 | |
| WO | 2016/087728 A1 | 6/2016 | |
| WO | WO-2016087728 A1 * | 6/2016 | ....... H01L 21/02532 |

OTHER PUBLICATIONS

International Search Report for International Application No. PCT/FR2017/051701 dated Nov. 9, 2017, 2 pages.
Hashimoto et al., Recent Development of Termperature Compensated SAW Devices, 2011 IEEE International Ultrasonics Symposium Proceedings, (2011), pp. 79-86.
Abbott et al., Characterization of Bonded Wafer for RF Filters with Reduced TCF, Proc. 2005 IEEE International Ultrasonics Symposium, Rotterdam, The Netherlands, (Sep. 19-21, 2005), pp. 926-929.
European Extended Search Report and Opinion for European Application No. 20165678, dated Jul. 13, 2020; 5 pages.
French Search report for French Application No. 1656191, dated Mar. 7, 2017, 2 pages.
French Written Opinion of the Patentability of the Invention for French Application No. 1656191, dated Mar. 7, 2017, 9 pages with English translation.
Taiwan Office Action for TW Application No. 106121443 dated Jul. 10, 2020, 12 pages.
Taiwan Search Report for TW Application No. 106121443 dated Jun. 26, 2020, 1 page.
Japanese Official Notice of Rejection for Japanese Patent Application No. 2018-568396 dated Jan. 26, 2021, 12 pages with translation.
Japanese Notice of Rejection from Japanese Application No. 2018-568396, dated Jun. 15, 2021, 8 pages.
Korean Notice of Preliminary Rejection for Korean Application No. 10-2019-7002818 dated Sep. 13, 2021, 5 pages.

* cited by examiner

HYBRID STRUCTURE FOR A SURFACE ACOUSTIC WAVE DEVICE

CROSS-REFERENCE TO RELATED APPLICATIONS

This application is a national phase entry under 35 U.S.C. § 371 of International Patent Application PCT/FR2017/051701, filed Jun. 26, 2017, designating the United States of America and published as International Patent Publication WO 2018/002504 A1 on Jan. 4, 2018, which claims the benefit under Article 8 of the Patent Cooperation Treaty to French Patent Application Serial No. 1656191, filed Jun. 30, 2016.

TECHNICAL FIELD

This disclosure relates to the field of surface acoustic wave devices. It relates, in particular, to a hybrid structure adapted for the manufacturing of surface acoustic wave devices and to a manufacturing method of the hybrid structure.

BACKGROUND

Surface Acoustic Wave devices (SAW) use one or more inter-digital transducers developed on a piezoelectric substrate to convert electrical signals into acoustic waves and vice versa. Such SAW devices or resonators are often used in filtering applications. Radio Frequency (RF) SAW technology on a piezoelectric substrate provides excellent performances such as high-insulation and low-insertion losses. For this reason, it is used for RF duplexers in wireless communication applications. Nevertheless, in order to be more competitive with RF duplexers based on Bulk Acoustic Wave (BAW) technology, RF SAW devices require that the temperature stability of their frequency response be improved.

The operating frequency dependence of the SAW devices according to the temperature, or the thermal coefficient of frequency (TCF), depends, on the one hand, on variations in the spacing between the interdigital electrodes of the transducers, which are generally due to the relatively high coefficient of thermal expansion (CTE) of the piezoelectric substrates used. On the other hand, the TCF depends on the coefficient of thermal velocity because the expansion or contraction of the piezoelectric substrate is accompanied by an increase or decrease in the velocity of the surface acoustic wave. To minimize the thermal coefficient of frequency (TCF), an aim is, therefore, to minimize the expansion/contraction of the piezoelectric substrate, especially in the surface zone in which the acoustic waves will propagate.

The article by K. Hashimoto, M. Kadota et al., "Recent development of temperature compensated SAW devices," IEEE Ultrasonic. Symp. 2011, pages 79-86, 2011, provides an overview of the approaches commonly used to overcome the temperature dependency problem of the frequency response of SAW devices.

One approach is to use a hybrid substrate, for example, composed of a layer of piezoelectric material arranged on a silicon substrate. The low CTE of the silicon makes it possible to limit the expansion/contraction of the piezoelectric layer according to temperatures. In the case of a piezoelectric layer of lithium tantalate ($LiTaO_3$), the article indicates that a ratio of 10 between the thickness of $LiTaO_3$ and the thickness of the silicon substrate makes it possible to adequately improve the thermal coefficient of frequency (TCF).

The document DE102004045181 also discloses a structure suitable for SAW applications, comprising a piezoelectric layer arranged on a compensating layer (for example, silicon).

One of the disadvantages of such a hybrid substrate comes from the presence of interfering acoustic waves (as called "spurious acoustic modes" in the article "Characterization of bonded wafer for RF filters with reduced TCF," B. P. Abbott et al., Proc. 2005 IEEE International Ultrasonics Symposium, Sept. 19-21, 2005, pp. 926-929), which negatively impact the frequency characteristics of the resonator arranged on the hybrid substrate. These interfering resonances are, in particular, related to interfering reflections on the underlying interfaces, especially the interface between the $LiTaO_3$ and the silicon. One solution to reduce these interfering resonances is to increase the thickness of the $LiTaO_3$ layer. This is supposed to also increase the thickness of the silicon substrate in order to retain the TCF improvements; the total thickness of the hybrid substrate is then no longer compatible with the thickness reduction needs of the final components, especially on the cellphone market. Another solution proposed by K. Hashimoto is to roughen the lower surface of the $LiTaO_3$ layer so as to limit the acoustic wave reflections on the $LiTaO_3$ layer. Such roughening presents a handling difficulty when a direct bonding process, requiring very smooth surfaces to be assembled, is used for the manufacturing of the hybrid substrate.

Another disadvantage of a hybrid substrate according to the prior art stems from the presence of the support of semiconductor silicon material, which even if it is highly resistive, is capable of containing free charge carriers and of impacting the performance of the device, especially by increasing the insertion losses and the distortions (linearity) of the RF signal with respect to a solid piezoelectric substrate.

To improve the performance of radiofrequency devices, the document WO2016/087728 proposes a structure comprising a trapping layer characterized by a density of specific defects, arranged on the support substrate.

BRIEF SUMMARY

A purpose of the present disclosure is to remedy some or all of the disadvantages of the prior art. An aim of the disclosure is to propose a hybrid structure enabling the reduction and/or elimination of the interfering acoustic waves and ensuring a stable performance for devices operating at high frequencies.

The present disclosure relates to a hybrid structure for surface acoustic wave device comprising a useful layer of piezoelectric material having a first face free and a second face placed on a carrier substrate whose coefficient of thermal expansion is lower than that of the useful layer, the hybrid structure being characterized in that it comprises:

a trapping layer interposed between the useful layer and the carrier substrate;

at least one functional interface of determined roughness between the useful layer and the trapping layer.

The trapping layer of the hybrid structure according to this disclosure effectively traps the potentially generated moving electric loads in the carrier substrate while operating the developed RF SAW device on the hybrid structure. The RF performances (linearity, insertion losses) thus reach a good level, comparable or even superior to that of technologies on large piezoelectric substrates.

The determined roughness functional interface allows efficient diffusion of the acoustic waves capable of propagating in depth in the useful layer, thus avoiding their interfering reflections, which are known to negatively impact the signal quality of the SAW device. This diffusion of the acoustic waves is rendered more efficient by the fact that the functional interface is located between the useful layer and the trapping layer. Indeed, in addition to its trapping qualities of moving loads, the trapping layer makes it possible to efficiently screen the underlying interface with the carrier substrate, the interface contributing in the hybrid structures to reflect acoustic waves.

According to advantageous features of the disclosure, taken alone or combined:
- the trapping layer is directly in contact with the carrier substrate;
- the trapping layer is formed of a material selected from among amorphous silicon, polycrystalline silicon, amorphous or polycrystalline germanium;
- the trapping layer is formed by implantation of atomic species in a surface layer of the carrier substrate or by etching and structuring of the surface layer of the carrier substrate;
- the determined roughness of the functional interface has a peak-to-valley amplitude greater than 0.3 micron, advantageously greater than or equal to 0.5 micron, or even 1 micron;
- the functional interface is formed by the interface between the useful layer and the trapping layer, the second face of the useful layer having the determined roughness;
- the functional interface is formed by the interface between a first interlayer arranged on the second face of the useful layer and the trapping layer; the trapping layer having the determined roughness;
- the first interlayer comprises a material selected from among silicon oxide, silicon nitride, silicon oxynitride, or a material of the same type as the one forming the useful layer;
- the hybrid structure comprises a second functional interface;
- the second functional interface is formed by the interface between the useful layer and a second interlayer arranged on the first interlayer, the second functional interface having a second determined roughness with a peak-to-valley amplitude greater than 0.1 micron;
- the second interlayer comprises a material selected from among silicon oxide, silicon nitride, silicon oxynitride, or a material of the same type as the one forming the useful layer;
- the first interlayer and the second interlayer are formed of the same material;
- the useful layer comprises a piezoelectric material selected from among lithium tantalate ($LiTaO_3$), lithium niobate ($LiNbO_3$), quartz, zinc oxide (ZnO), or aluminum nitride (AlN);
- the carrier substrate is a solid substrate or a composite substrate comprising at least one blank layer or comprising all or part of microelectronic components.

The present disclosure also relates to a surface acoustic wave device comprising a hybrid structure such as above.

The present disclosure further relates to a manufacturing method of a hybrid structure for a surface acoustic wave device comprising:
- a step of providing a useful layer of piezoelectric material comprising a first face and a second face having a determined roughness;
- a step of providing a carrier substrate having a coefficient of thermal expansion lower than the useful layer;
- an assembly step for arranging the useful layer on the carrier substrate;

wherein, the method further comprises, prior to the assembly step, a forming step of a trapping layer on the second face of the useful layer, the interface between the trapping layer and the useful layer forming a functional interface of determined roughness, the assembling step being carried out between the trapping layer and the carrier substrate.

The present disclosure also relates to another manufacturing method of a hybrid structure for a surface acoustic wave device comprising:
- a step of providing a useful layer of piezoelectric material comprising a first face and a second face;
- a step of providing a carrier substrate having a coefficient of thermal expansion lower than the useful layer;
- an assembly step for arranging the useful layer on the carrier substrate;

wherein, the method further comprises, prior to the assembly step:
- a forming step of a trapping layer having a determined roughness on the carrier substrate;
- a forming step of a first interlayer on the trapping layer, the interface between the trapping layer and the first interlayer forming a functional interface of determined roughness.

According to advantageous features of this manufacturing method, taken alone or combined:
- the determined roughness of the functional interface has a peak-to-valley amplitude greater than 0.3 micron, advantageously greater than or equal to 0.5 micron, or even 1 micron;
- the assembly step takes place between the first interlayer and the second face of the useful layer;
- the manufacturing method of a hybrid structure comprises, prior to the assembly step, a forming step of a second interlayer on the second face of the useful layer having a second determined roughness, the assembling step being carried out between the first interlayer and the second interlayer; the interface between the useful layer and the second interlayer forming a second functional interface.

BRIEF DESCRIPTION OF THE DRAWINGS

Other characteristics and advantages of the disclosure will emerge from the detailed description that follows, with reference to the accompanying drawings in which.

DETAILED DESCRIPTION

In the descriptive part, the same references in the figures may be used for elements of the same type.

The figures are schematic representations that, for the sake of clarity, are not to scale. Especially, the thicknesses of the layers along the z axis are not to scale with respect to the lateral dimensions along the x and y axes.

Figure 1:
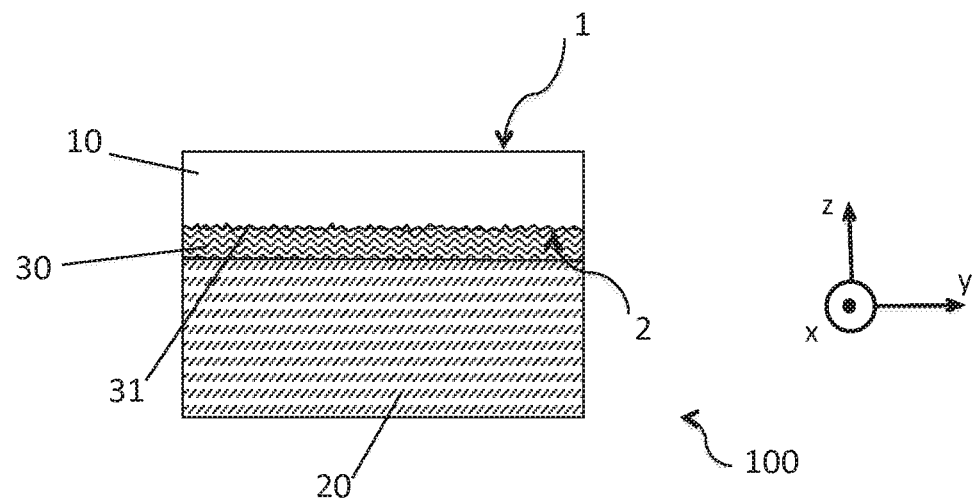
FIGS. 1 to 3 show hybrid structures according to the disclosure.

As illustrated in FIG. 1, a hybrid structure 100 for a surface acoustic wave device comprises a useful layer 10 of piezoelectric material having a free first face 1 and a second face 2. The useful layer 10 comprises a piezoelectric material selected from among, for example, lithium tantalate ($LiTaO_3$), lithium niobate ($LiNbO_3$), quartz, zinc oxide (ZnO), or aluminum nitride (AlN).

The useful layer 10 is arranged on a carrier substrate 20 whose coefficient of thermal expansion is lower than that of the useful layer 10. The carrier substrate 20 is, for example, formed of silicon or germanium.

The hybrid structure 100 according to the disclosure also comprises a trapping layer 30 interposed between the useful layer 10 and the carrier substrate 20. The term "trapping layer" is understood to mean a layer capable of trapping the moving electric loads likely to be present in the carrier substrate 20. By way of example, the trapping layer 30 is formed of a material chosen among amorphous silicon, polycrystalline silicon, amorphous or polycrystalline germanium. The trapping layer 30 may also be formed by a technique or combination of techniques including:

the ion implantation into a surface layer of the carrier substrate 20; for a silicon substrate, an implantation of, for example, argon, silicon or nitrogen ions may be carried out in order to generate a perturbed surface layer capable of trapping moving loads originating from the carrier substrate 20;
 or by etching and structuring a surface layer of the carrier substrate 20, for example, by mechanical, wet, or dry chemical etching, inducing a structuring of the surface, a preferred trapping site for moving loads originating from the carrier substrate 20.

The thickness of the trapping layer 30 may be between a few tens of nanometers and a few microns, or even a few tens of microns.

Advantageously, the trapping layer 30 is directly in contact with the carrier substrate 20, which allows for efficient trapping of the moving loads, generated in the carrier substrate 20.

The hybrid structure 100 according to the disclosure also comprises at least one functional interface 31 of determined roughness between the useful layer 10 and the trapping layer 30. The roughness of the functional interface 31 is defined by the maximum peak-to-valley amplitude, measured, for example, by mechanical or optical profilometry on measure profiles of about 50 microns to 500 microns or measure surfaces of about 50×50 $\mu m^2$ to 500×500 $\mu m^2$. Advantageously, the peak-to-valley determined roughness is greater than 0.3 micron. Advantageously, it is even greater than or equal to 0.5 micron, or even 1 micron. It is preferably between 0.3 micron and 5 microns.

Also advantageously, the spectral density (PSD) of the roughness of the functional interface 31 covers all or part of the spectral band of wavelengths of the interfering waves, which are desired to be eliminated. Preferably, the determined roughness has spatial wavelengths and an amplitude at least equal to a quarter of the interfering wavelengths.

The determined roughness of the functional interface 31 can, therefore, be adapted in amplitude and potentially in spectral density depending on the frequency of the acoustic waves of the SAW device, which will be manufactured on the hybrid structure 100, for its ability to efficiently diffuse the acoustic waves susceptible to spread in the useful layer 10.

The trapping layer 30 of the hybrid structure 100 according to the disclosure effectively traps the potentially generated moving electric loads in the carrier substrate 20 during operation of the RF SAW device developed on the first face 1 of the hybrid structure 100. The RF performances (linearity, insertion losses) thus reach a very good level, comparable or even superior to that of the technologies on massive piezoelectric substrates.

The functional interface 31 of determined roughness enables efficient diffusion of the acoustic waves capable of spreading in depth in the useful layer 10, thus avoiding their interfering reflections, which are known to negatively impact the signal quality of the SAW device.

According to a first embodiment, illustrated in FIG. 1, the functional interface 31 is formed by the interface between the useful layer 10 and the trapping layer 30.

Figure 2:
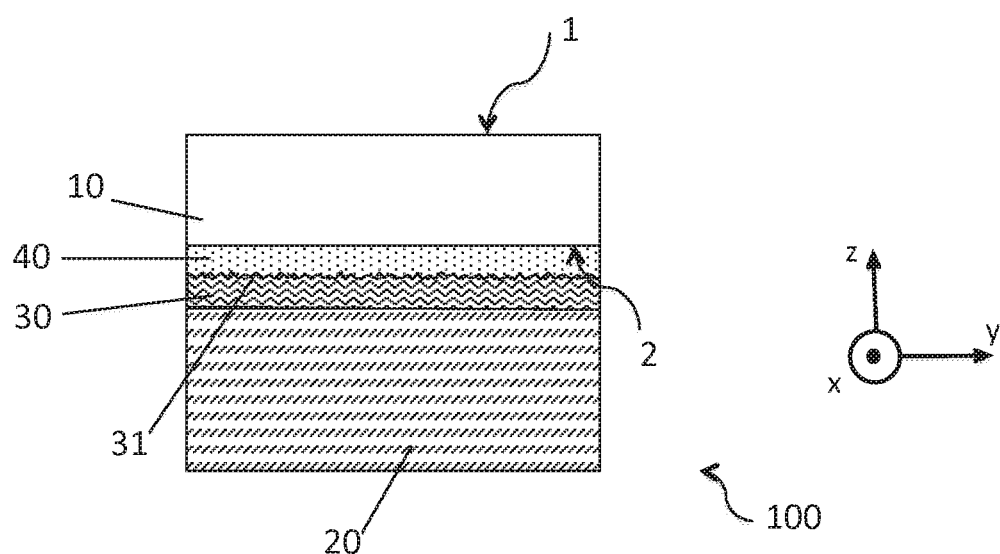

According to a second embodiment, illustrated in FIG. 2, the functional interface 31 is formed by the interface between a first interlayer 40 arranged on the second face 2 of the useful layer 10 and the trapping layer 30. By way of example, the first interlayer 40 may comprise a material chosen among silicon oxide, silicon nitride, silicon oxynitride or a material of the same type as the useful layer.

These two embodiments are advantageous in that the trapping layer 30 makes it possible to keep away and to screen the underlying interface with the carrier substrate 20, the latter being a strong contributor, in the usual hybrid structures, to the reflection of the acoustic waves spreading in the volume of the useful layer 10. The interface with the carrier substrate 20 is screened in the sense that the majority, if not all, of the acoustic waves reaching the functional interface 31 will be efficiently diffused by the latter and thus never reach that interface.

Figure 3:
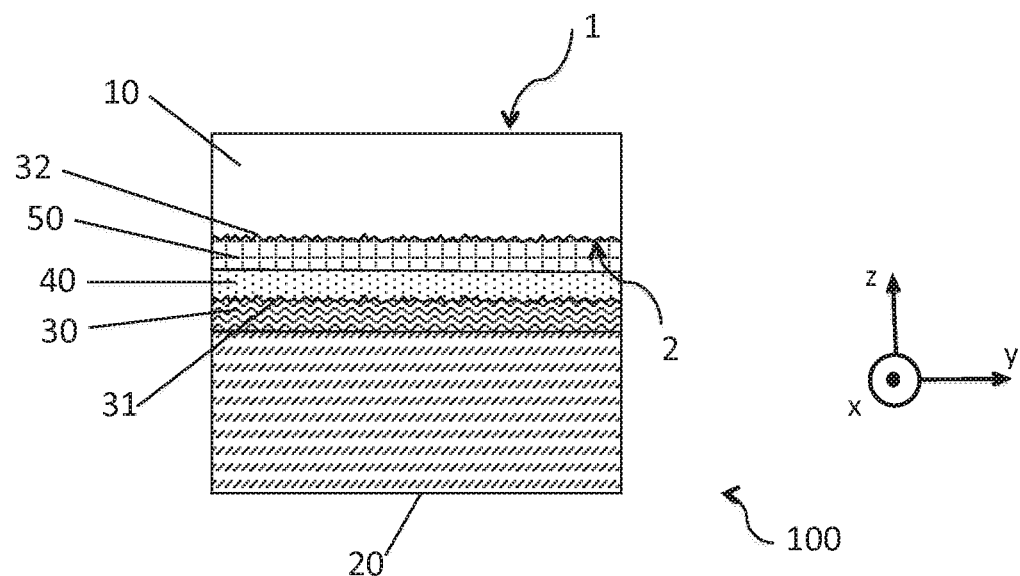

According to a third embodiment, illustrated in FIG. 3, the hybrid structure 100 comprises a second functional interface 32 having a second determined roughness, whose peak-to-valley amplitude is greater than 0.1 micron. It is preferably between 0.1 micron and 5 microns. It will be noted that the second functional interface 32 may have a second determined roughness different from the determined roughness of the first functional interface 31, both in amplitude and in spectral density. Advantageously, the spectral densities may be chosen to cover in a complementary manner the spectral band of wavelengths of the interfering waves, which are desired to be eliminated.

The second functional interface 32 is formed by the interface between the useful layer 10 and a second interlayer 50 arranged on the first interlayer 40. By way of example, the second interlayer 50 comprises a material chosen among silicon oxide, silicon nitride, and silicon oxynitride. The second interlayer 50 may also comprise a material of the same type as that constituting the useful layer 10. For a useful layer 10 made of $LiTaO_3$, the second interlayer 50 may, for example, consist of a deposited amorphous $LiTaO_3$ layer.

According to an advantageous variant of this third embodiment, the first interlayer 40 and the second interlayer 50 are formed of the same material; thus, the interface between these two layers contributes little or nothing to interfering reflections, due to the absence of any difference in acoustic impedance between the two layers.

In the various embodiments described, the carrier substrate is a bulk substrate. Alternatively, it may consist of a composite substrate comprising at least one blank layer or a structured layer, comprising all or part of microelectronic components. These configurations are particularly advantageous for producing co-integrated systems, including surface acoustic wave devices in and on the useful layer 10, and components (switches, amplifiers, other filters, etc.) in the carrier substrate.

Figure 4:
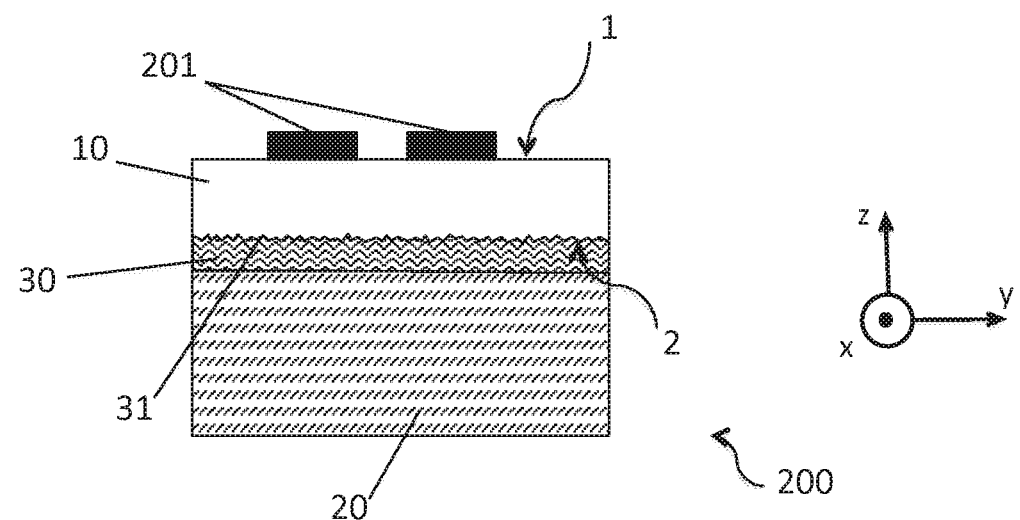
FIG. 4 shows a surface acoustic wave device according to the disclosure.

The disclosure also relates to a surface acoustic wave device 200 comprising a hybrid structure 100, illustrated in FIG. 4. The device 200 comprises, for example, interdigital metal electrodes 201 on the first face 1 of the useful layer 10, between which spread the acoustic waves.

The hybrid structure 100 is particularly suitable for the manufacturing of surface acoustic wave devices 200 using acoustic wave frequencies ranging from 700 MHz to 3 GHz.

The disclosure also relates to a manufacturing method of a hybrid structure 100 for a surface acoustic wave device 200, which will be described with reference to FIGS. 5A to 7E.

The manufacturing method first comprises a step of providing a useful layer 10 of piezoelectric material comprising a first face 1 and a second face 2 having a determined roughness. The roughness is defined by the peak-to-valley maximum amplitude, measured, for example, by mechanical or optical profilometry, on measurement profiles of about 50 to 500 microns or measuring surfaces of about 50×50 $\mu m^2$ to 500×500 $\mu m_2$. Advantageously, the determined roughness is greater than 0.3 micron, even greater than or equal to 0.5 micron, or even greater than 1 micron. Preferably, it is even between 0.3 micron and 5 microns.

Also advantageously, the spectral density of the roughness of the functional interface 31 covers all or part of the spectral band of wavelengths of the interfering waves, which are desired to be eliminated. Preferably, the determined roughness has spatial wavelengths and an amplitude at least equal to a quarter of the interfering wavelengths.

The determined roughness of the functional interface 31 can, therefore, be adapted in amplitude and potentially in spectral density depending on the frequency of the acoustic waves of the SAW device that will be manufactured on the hybrid structure 100 for its ability to effectively diffuse the acoustic waves susceptible to spread in the useful layer 10.

The determined roughness can be achieved on the second face 2 by mechanical lapping techniques, chemical-mechanical polishing, wet or dry chemical etching, or a combination of these various techniques. The aim is to create on the second face 2 of the useful layer 10 a uniform roughness of determined amplitude over the whole face. By way of example, such a roughness can be obtained by the typical treatments of the roughened rear faces of the wafers (lithium tantalate, lithium niobate, etc.) used in the semiconductor industry.

As previously stated and without it being limiting, the useful layer 10 comprises a piezoelectric material selected from among lithium tantalate ($LiTaO_3$), lithium niobate ($LiNbO_3$), quartz, zinc oxide (ZnO), or aluminum nitride (AlN).

Figure 5A:
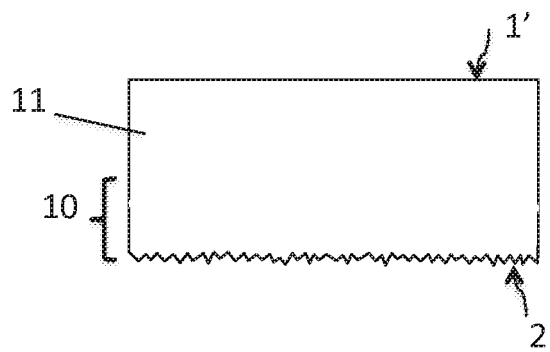
FIGS. 5A-5E, 6A-6E, and 7A-7E show manufacturing methods of hybrid structures according to the disclosure.
Figure 5A:
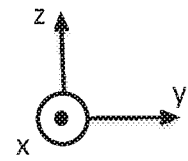

According to an advantageous embodiment, the useful layer 10 is included in a donor substrate 11, having a second face 2 of determined roughness and a first face 1' (FIG. 5A).

Figure 5B:
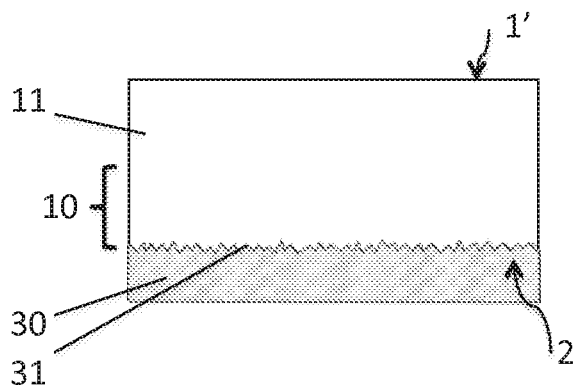
Figure 5C:
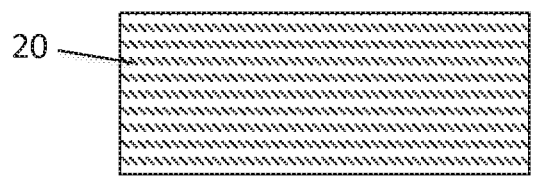

The manufacturing method according to the disclosure also comprises a forming step of a trapping layer 30 on the second face 2 of the useful layer 10 or of the donor substrate 11 (FIG. 5B). The interface between the trapping layer 30 and the useful layer 10 (or the donor substrate 11) forms a functional interface 31 of determined roughness. Advantageously, the trapping layer 30 is formed of a material chosen among amorphous silicon, polycrystalline silicon, amorphous or polycrystalline germanium. The trapping layer 30 can be prepared by known chemical deposition techniques (PECVD, LPCVD, etc.).

The trapping layer 30 typically has a thickness of between a few tens of nanometers and a few microns, or even a few tens of microns.

Advantageously, the forming step of the trapping layer 30 comprises a step of smoothing the free surface of the trapping layer 30, consisting, for example, of chemical mechanical polishing, smoothing plasma etching or wet chemical etching. Preferably, the free surface of the trapping layer 30 will have a low roughness (typically<0.5 nm RMS, measured by atomic force microscopy) and good flatness, for the purpose of a subsequent assembly step.

The manufacturing method also includes a step of providing a carrier substrate 20 (FIG. 5C) having a coefficient of thermal expansion lower than that of the useful layer 10. Advantageously, the carrier substrate 20 is made of silicon, this material being widely available and compatible with the semiconductor industry. Alternatively, it may also be made of germanium or other materials compatible with the subsequent steps of the method and the preparation of the surface acoustic wave device.

Figure 5D:
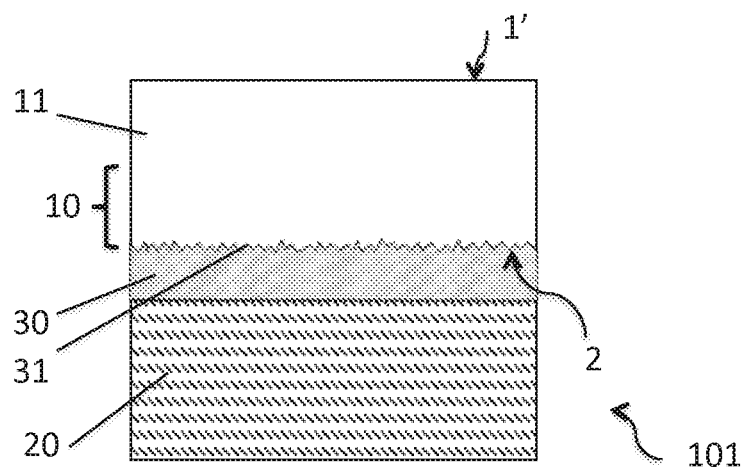
Figure 5D:
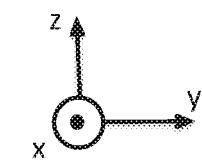

The manufacturing method then comprises an assembly step for arranging the donor substrate 11 (or the useful layer 10) on the carrier substrate 20 (FIG. 5D). The assembly step takes place between the trapping layer 30 and the carrier substrate 20, so the surface properties of the trapping layer 30 and of the carrier substrate 20 must be properly controlled. Advantageously, the assembly step comprises direct bonding by molecular adhesion. This molecular adhesion bonding technique is preferred in that it does not require the use of a layer of additional material.

Alternatively, the assembly step may include adhesive bonding, metal bonding, anodic bonding, or any other type of bonding known from the state of the art and compatible with the intended utilization.

Advantageously, the assembly step comprises, prior to bonding, a cleaning sequence to ensure a good level of cleanliness (removal of particles, hydrocarbon and metal contaminants, etc.) from the surfaces before bonding.

According to a variant of the method, a layer of the same type as the trapping layer 30 may be arranged on the carrier substrate 20 prior to the assembly step and will be prepared in order to be bonded to the trapping layer 30. Indeed, depending on the type of the trapping layer 30 and that of the carrier substrate 20, it may be advantageous, especially in the case of direct bonding by molecular adhesion, to form a bonding interface between two materials of the same type.

To consolidate the bonding interface, the bonded hybrid structure 101 can be subjected to a heat treatment. It should be noted that the materials of the donor substrate 11 (or of the useful layer 10) and of the carrier substrate 20 exhibit very different coefficients of thermal expansion. The heat treatment applied must, therefore, remain at a temperature lower than the temperature of damage or breakage of the bonded hybrid structure 101. The temperature range is typically between a few tens of degrees and 500° C.

In the case illustrated in FIGS. 5A to 5E, where the useful layer 10 is included in a donor substrate 11, the manufacturing process furthermore comprises a step of thinning the donor substrate 11 (FIG. 5E) to form the useful layer 10 and the first face 1, on which the surface acoustic wave devices will be prepared.

This thinning step can be carried out using various known techniques of the prior art, in particular:
   the SMART CUT® process, which is particularly suited to the formation of very thin useful layers (typically of thickness less than or equal to 1 micron): it is based on an implantation of gaseous species in the donor substrate 11, at the level of its second face 2, prior to the assembly step, to form a weakened buried plane; after assembly, the donor substrate 11 will separate along the weakened plane, so as to leave integral with the carrier substrate 20 only the useful layer 10.

chemical-mechanical thinning processes, including mechanical lapping, chemical-mechanical polishing and chemical etching, suitable for the formation of useful layers of thicknesses ranging from a few microns to a few tens, or even hundreds of microns.

Figure 5E:
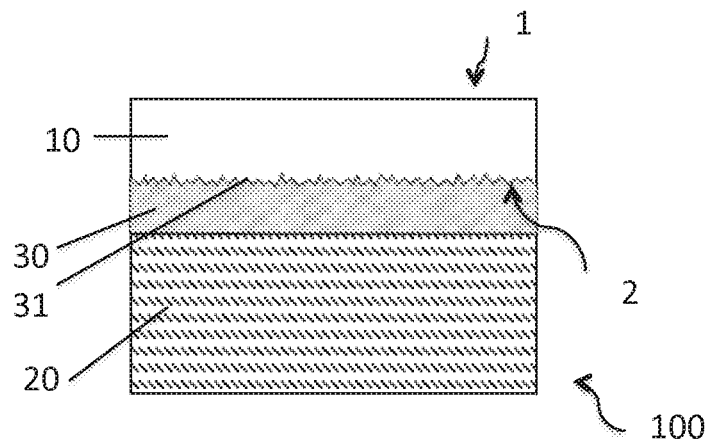

At the end of this manufacturing process, a hybrid structure 100 according to the disclosure is obtained (FIG. 5E).

The disclosure relates to another manufacturing method of a hybrid structure 100 for a surface acoustic wave device, first comprising a step of providing a useful layer 10 of piezoelectric material comprising a first face 1 and a second face 2.

As stated above and without limitation, the useful layer 10 comprises a piezoelectric material selected from among lithium tantalate ($LiTaO_3$), lithium niobate ($LiNbO_3$), quartz, zinc oxide (ZnO), or aluminum nitride (AlN).

Figure 6A:
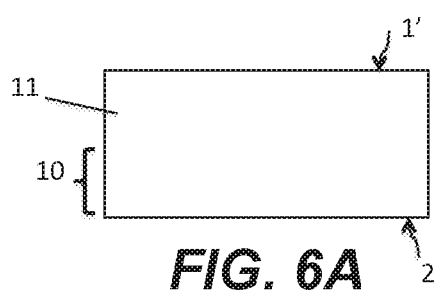
Figure 6A:
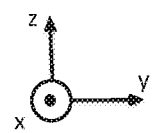

According to an advantageous embodiment, the useful layer 10 is included in a donor substrate 11 having a second face 2 and a first face 1' (FIG. 6A).

The manufacturing method also comprises a step of providing a carrier substrate 20 having a coefficient of thermal expansion lower than the useful layer 10. Advantageously, the carrier substrate 20 is made of silicon, the material being widely available and compatible with the semiconductor industry. As mentioned above, it may alternatively be formed or comprise germanium or other materials compatible with the subsequent manufacturing steps.

Figure 6B:
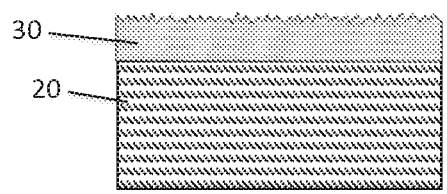
Figure 6B:
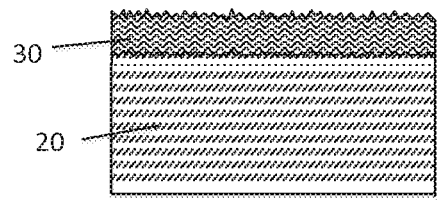
Figure 6C:
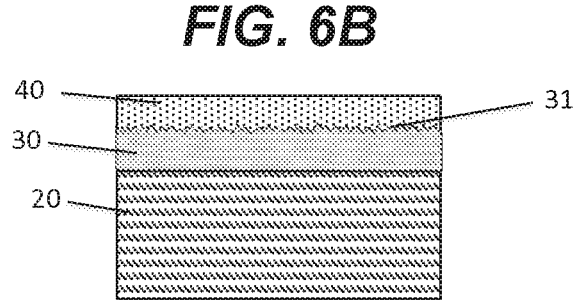

The manufacturing method also comprises a forming step of a trapping layer 30 on the carrier substrate 20 (FIG. 6B). The trapping layer 30 has a predetermined roughness.

Advantageously, the trapping layer 30 is formed of a material selected from among amorphous silicon, polycrystalline silicon, amorphous or polycrystalline germanium. It can be prepared by known techniques of chemical deposition (CVD).

The trapping layer 30 may also be formed by a technique or combination of techniques including:
- the ion implantation in a surface layer of the carrier substrate 20; for a silicon substrate, an implantation, for example, of argon ions, silicon, nitrogen, etc., may be carried out to generate a disturbed surface layer capable of trapping moving loads from the carrier substrate 20;
- or by etching and structuring a surface layer of the carrier substrate 20; for example, by mechanical etching, wet or dry chemical, inducing a structuring of the surface, a trapping privileged site for moving loads from the carrier substrate 20.

The trapping layer 30 may have a thickness ranging from a few tens of nanometers to several microns or tens of microns.

The roughness of the free surface of the trapping layer 30, after its formation on the carrier substrate 20, is defined by the maximum peak-to-valley amplitude, measured, for example, by mechanical or optical profilometry on measure profiles of about 50 microns to 500 microns or measure surfaces of about 50×50 $\mu m^2$ to 500×500 $\mu m_2$. Advantageously, the determined roughness is greater than 0.3 micron, or even greater than or equal to 0.5 micron, or even greater than or equal to 1 micron. It is preferably between 0.3 micron and 5 microns.

Also advantageously, the spectral density of the roughness of the functional interface 31 covers all or part of the spectral band of wavelengths of the interfering waves, which are desired to be eliminated. Preferably, the determined roughness has spatial wavelengths and an amplitude at least equal to a quarter of the interfering wavelengths.

The determined roughness can be obtained on the free surface of the trapping layer 30, either directly after deposition of the layer, or by mechanical lapping techniques, chemical-mechanical polishing, wet or dry chemical etching, or a combination of these techniques. The aim is to create on the free surface of the trapping layer 30 a uniform roughness of determined amplitude. By way of example, such roughness may be obtained by "acid etch" type treatments or "alkali etch" made for the treatment of roughened rear faces of the silicon wafers used in the semiconductor industry. According to another example, the determined roughness of the free surface of the trapping layer 30 may be obtained by mechanical lapping (typically with a diamond wheel of grain 2000) and wet chemical etching (typically by TMAH) of the surface of the carrier substrate 20 before depositing a trapping layer 30 in polycrystalline silicon; the free surface of the trapping layer 30 after deposition on the carrier substrate 20 has then the determined roughness of about 0.5 microns peak-to-valley (FIG. 6B').

The manufacturing method then comprises a forming step of a first interlayer 40 on the trapping layer 30. The interface between the trapping layer 30 and the first interlayer 40 forms the functional interface 31 of determined roughness. The first interlayer 40 may comprise a material selected from among silicon oxide, silicon nitride, silicon oxynitride, or a material of the same type as the useful layer 10. It may be prepared by chemical deposition. Advantageously, a smoothing step (for example, chemical-mechanical polishing) is carried out on the free surface of the first interlayer 40, for the purpose of the subsequent assembly step on the donor substrate 11 (or the useful layer 10). This option is particularly suitable when the subsequent assembly step includes bonding by molecular adhesion.

The first interlayer 40 may also comprise a polymeric material, which may, for example, be deposited by centrifugation. The advantage of this type of material is that the smoothing can be carried out directly during the deposition. This option is particularly suitable when the subsequent joining step comprises an adhesive bonding.

Figure 6D:
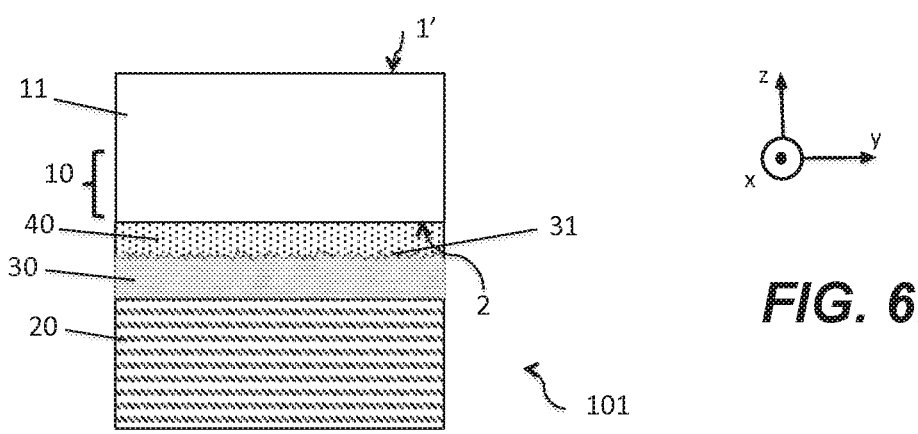

Finally, the manufacturing method comprises an assembly step for arranging the donor substrate 11 (or useful layer 10) on the supporting carrier substrate 20. In particular, the assembly is carried out between the first interlayer 40 and the second face 2 of the donor substrate 11 (FIG. 6D).

Advantageously, the assembling step includes a direct bonding by molecular adhesion. This molecular bonding technique is advantageous in that it does not require the use of an additional material layer. Alternatively, the joining step may include adhesive bonding, metal bonding, anodic bonding, or any other kind of bonding known in the prior art and compatible with the intended application. Advantageously, the assembling step includes, prior to bonding, a cleaning sequence to ensure a good level of cleanliness (removal of particles, hydrocarbons and metal contaminants) to the surfaces before bonding.

To consolidate the bonding interface, the bonded hybrid structure 101 may be subjected to a heat treatment, at low or medium temperature to prevent damage to the heterostructure, typically between several tens of degrees and 500° C.

In the instance, illustrated in FIGS. 6A to 6E, where the useful layer 10 is included in a donor substrate 11, the manufacturing method furthermore comprises a thinning step of the donor substrate 11 (FIG. 6E) to form the useful layer 10 and the first face 1, on which the surface acoustic wave devices will be developed.

This thinning step can be made from various techniques known in the prior art, as previously discussed.

Figure 6E:
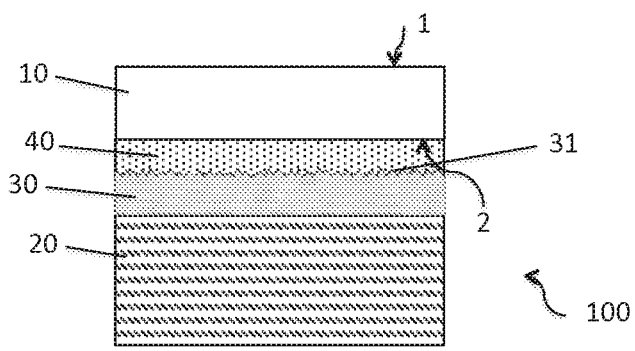

At the end of this manufacturing method, a hybrid structure 100 according to the disclosure is obtained (FIG. 6E).

Figure 7A:
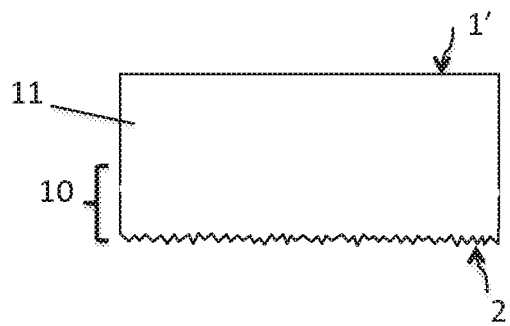
Figure 7A:
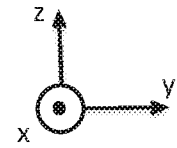

According to a variant of the above manufacturing method, illustrated in FIGS. 7A to 7E, the second face 2 of the useful layer 10 (or donor substrate 11, in the case where the useful layer 10 is included in a donor substrate) has a second determined roughness (FIG. 7A). The peak-to-valley amplitude of the second determined roughness is advantageously greater than 0.1 micron.

Figure 7B:
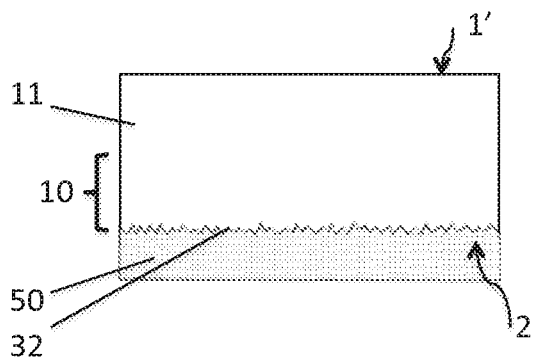

This variant of the manufacturing method comprises a forming step of a second interlayer 50 on the second face 2 of the useful layer 10 or the donor substrate 11 as shown in FIG. 7B. The second interlayer 50 may comprise a material or a stack of materials selected from among silicon oxide, silicon nitride, and silicon oxynitride. The second interlayer 50 may also comprise a material of the same type as that forming the useful layer 10 to limit the problems associated with differences in thermal expansion.

The interface between the useful layer 10 and the second interlayer 50 forms a second functional interface 32. Advantageously, the forming step of the second interlayer 50 includes a step of smoothing its free surface for the purpose of the assembly step.

Figure 7C:
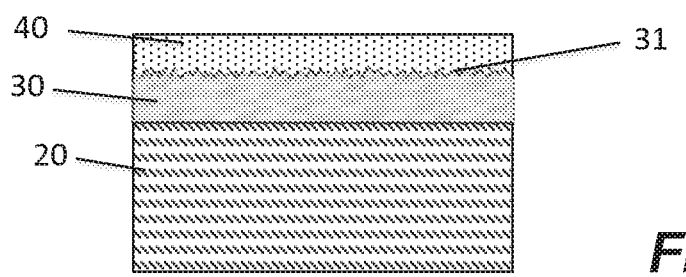
Figure 7D:
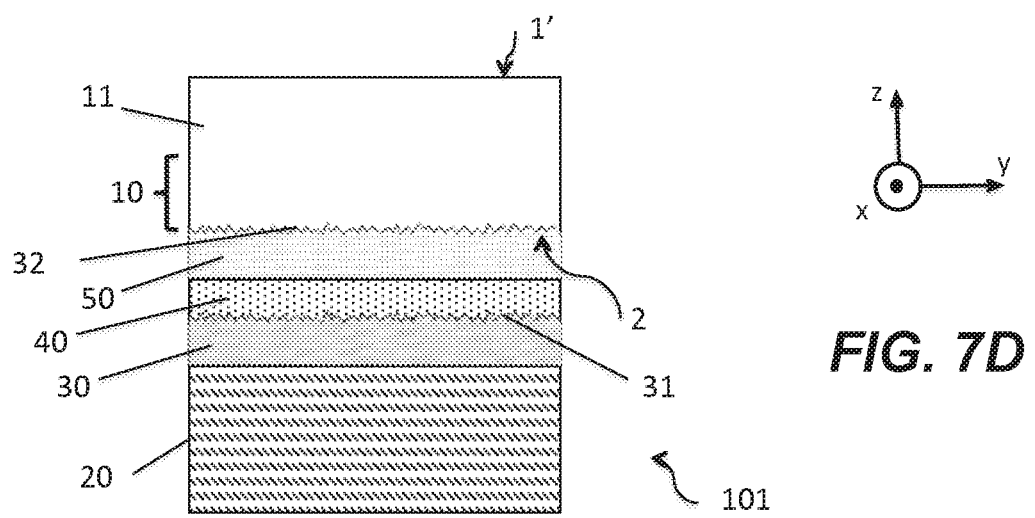

Prior to the assembly step, the trapping layer 30 having a first predetermined roughness is formed on the carrier substrate 20. Then, the first interlayer 40 is formed on trapping layer 30 (FIG. 7C). The interface between these two layers forms the functional interface 31 of determined roughness.

Optionally, the first 40 and second 50 interlayers may be composed of the same material.

This variant of the manufacturing method further comprises the assembly of the first 40 and second 50 interlayers, advantageously by direct bonding, but this is not to be taken in a limiting manner.

A heat treatment may optionally be carried out to consolidate the bonding interface of the bonded hybrid structure 101.

Figure 7E:
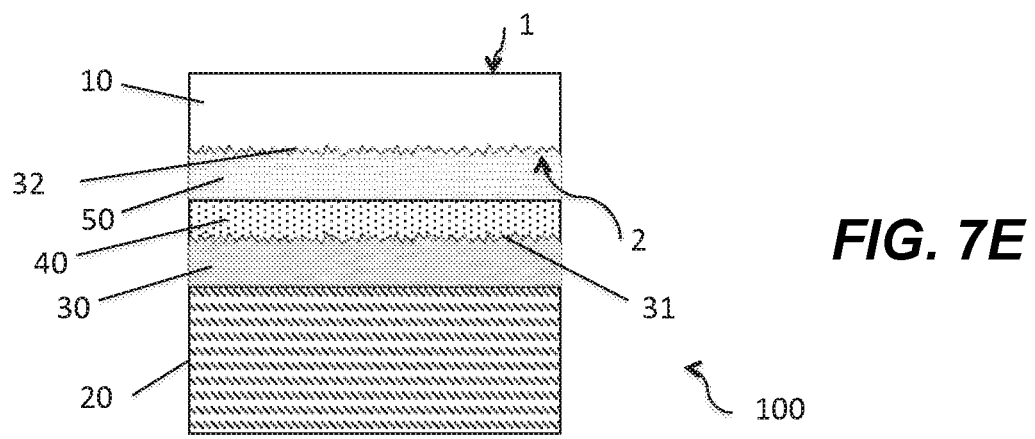

When the useful layer 10 is included in a donor substrate 11, a thinning step, as already stated previously, is realized, leading to the obtaining of the hybrid structure 100 (FIG. 7E).

Of course, the disclosure is not limited to the described embodiments and can be applied to alternative embodiments within the scope of the invention as defined by the claims.

The invention claimed is:

1. A hybrid structure for a surface acoustic wave device, comprising:
   a useful layer of piezoelectric material having a first face free and a second face;
   a carrier substrate having a coefficient of thermal expansion lower than a coefficient of thermal expansion of the useful layer;
   a trapping layer interposed between the useful layer and the carrier substrate, the trapping layer capable of trapping moving electric loads present in the carrier substrate;
   a first interlayer between the second face of the useful layer and the trapping layer;
   a second interlayer on the first interlayer; and
   at least one functional interface between the useful layer and the trapping layer, the at least one functional interface including:
   a first functional interface between the first interlayer and the trapping layer, a surface of the trapping layer having a first determined roughness having a peak-to-valley amplitude greater than 0.3 micron; and
   a second functional interface comprising an interface between the useful layer and the second interlayer, the second functional interface having a second determined roughness whose peak-to-valley amplitude is greater than 0.1 micron, the second determined roughness differing from the first determined roughness.

2. The hybrid structure of claim 1, wherein the trapping layer is in direct physical contact with the carrier substrate.

3. The hybrid structure of claim 1, wherein the trapping layer comprises a material selected from the group consisting of amorphous silicon, polycrystalline silicon, amorphous germanium, and polycrystalline germanium.

4. The hybrid structure of claim 1, wherein the trapping layer is formed by implantation of atomic species in a surface layer of the carrier substrate or by etching and structuring of the surface layer of the carrier substrate.

5. The hybrid structure of claim 1, wherein the first interlayer comprises a material selected the group consisting of silicon oxide, silicon nitride, silicon oxynitride, or a material of the useful layer.

6. The hybrid structure of claim 1, wherein the second interlayer comprises a material selected from the group consisting of silicon oxide, silicon nitride, silicon oxynitride or a material of the useful layer.

7. The hybrid structure of claim 1, wherein the useful layer comprises a piezoelectric material selected from the group consisting of lithium tantalate ($LiTaO_3$), lithium niobate ($LiNbO_3$), quartz, zinc oxide (ZnO), and aluminum nitride (AlN).

8. The hybrid structure of claim 1, wherein the carrier substrate is a bulk substrate, a composite substrate comprising at least one blank layer, or a substrate comprising at least a portion of microelectronic components.

9. A surface acoustic wave device comprising a hybrid structure according to claim 1.

10. A method of manufacturing a hybrid structure for a surface acoustic wave device, comprising:
    providing a useful layer of piezoelectric material having a first face and a second face;
    providing a carrier substrate having a coefficient of thermal expansion lower than the useful layer;
    forming a trapping layer having a determined roughness on the carrier substrate, the trapping layer capable of trapping moving electric loads present in the carrier substrate;
    forming a first interlayer on the trapping layer, an interface between the trapping layer and the first interlayer forming a functional interface having a determined roughness;
    forming a second interlayer on the second face of the useful layer, the second interlayer having a surface having a second determined roughness; and
    after forming the second interlayer on the second face of the useful layer, assembling the useful layer on the carrier substrate with the trapping layer, the first interlayer, and the second interlayer between the useful layer and the carrier substrate, an interface between the useful layer and the second interlayer forming a second functional interface.

* * * * *